United States Patent [19]

Balyasny et al.

[11] Patent Number: 5,373,230
[45] Date of Patent: Dec. 13, 1994

[54] TEST CLIP FOR FIVE PITCH IC

[75] Inventors: Marik Balyasny, Burbank; Mark S. Fisher, Fountain Valley, both of Calif.

[73] Assignee: ITT Corporation, Secaucus, N.J.

[21] Appl. No.: 4,806

[22] Filed: Jan. 13, 1993

Related U.S. Application Data

[63] Continuation-in-part of Ser. No. 716,564, Jun. 17, 1991, abandoned.

[51] Int. Cl.⁵ .................................. G01R 31/00
[52] U.S. Cl. .................................. 324/158.1; 439/70
[58] Field of Search ............ 324/72.5, 158 P, 158 F; 439/65, 70, 72, 67, 912

[56] References Cited

U.S. PATENT DOCUMENTS

| | | | |
|---|---|---|---|
| 3,377,514 | 4/1968 | Ruehlemann et al. | 317/101 |
| 3,441,853 | 4/1969 | Bodine | 324/158 |
| 3,454,921 | 7/1969 | Coleman et al. | 339/174 |
| 3,551,878 | 12/1970 | Rossman | 339/75 |
| 3,846,734 | 11/1974 | Pauza et al. | 339/17 |
| 4,012,097 | 3/1977 | Long et al. | 324/158 F |
| 4,068,170 | 1/1978 | Chayka et al. | 324/72.5 |
| 4,190,311 | 2/1980 | Basta | 339/75 |
| 4,419,626 | 12/1983 | Cedrone et al. | 324/158 |
| 4,473,798 | 9/1984 | Cedrone et al. | 324/158 |
| 4,508,403 | 4/1985 | Weltman et al. | 339/28 |
| 4,516,072 | 5/1985 | Marpoe, Jr. | 324/158 |
| 4,541,676 | 9/1985 | Hansen et al. | 339/17 |
| 4,547,028 | 10/1985 | Morgan et al. | 339/14 |
| 4,556,269 | 12/1985 | Andersson et al. | 339/75 |
| 4,574,235 | 3/1986 | Kelly et al. | 324/158 |
| 4,639,058 | 1/1987 | Morgan | 339/17 |
| 4,683,425 | 7/1987 | Tosutto et al. | 324/158 |
| 4,714,436 | 12/1987 | Jones | 439/497 |
| 4,716,500 | 12/1987 | Payne | 361/398 |
| 4,735,580 | 4/1988 | Hansen et al. | 439/264 |
| 4,739,257 | 4/1988 | Jenson et al. | 324/158 |
| 4,747,784 | 5/1988 | Cedrone | 439/71 |
| 4,749,362 | 6/1988 | Hoffman et al. | 439/269 |
| 4,766,371 | 8/1988 | Moriya | 324/158 |
| 4,767,985 | 8/1988 | Shearer, Jr. et al. | 324/158 F |
| 4,782,291 | 11/1988 | Blandin | 324/158 |
| 4,797,118 | 1/1989 | Feamster | 439/264 |
| 4,822,295 | 4/1989 | Porter | 439/330 |
| 4,835,464 | 5/1989 | Slye et al. | 324/158 |
| 4,835,469 | 5/1989 | Jones et al. | 324/158 |
| 4,836,797 | 6/1989 | Riechelmann | 439/264 |
| 4,859,189 | 8/1989 | Petersen et al. | 437/67 |
| 4,862,076 | 8/1989 | Renner et al. | 324/158 |
| 4,917,613 | 4/1990 | Kabadi | 439/67 |
| 4,919,623 | 4/1990 | Billman et al. | 439/70 |
| 4,936,783 | 6/1990 | Petersen | 439/70 |
| 4,956,604 | 9/1990 | Cedrone | 324/158 |
| 4,970,460 | 11/1990 | Jensen et al. | 324/158 |
| 4,978,912 | 12/1990 | Vonder et al. | 324/158 |
| 4,981,441 | 1/1991 | Ignasiak | 439/269 |
| 4,996,476 | 2/1991 | Balyasny et al. | 439/70 |
| 5,049,813 | 9/1991 | Van Loan et al. | 324/158 F |
| 5,202,622 | 4/1993 | Cole et al. | 324/158 F |

*Primary Examiner*—Vinh Nguyen
*Attorney, Agent, or Firm*—Thomas L. Peterson

[57] ABSTRACT

A fine pitch test clip is provided, which assures accurate alignment of the test lead contacts with the IC (integrated circuit) device leads. The test clip includes a center for lying over the IC body and four arms (e.g. 41 in FIG. 4) pivotally mounted on the center, with each arm including a row of contacts (52) mounted in the arm housing. Lower portions of the contacts, which engage the IC device leads (30), are separated by barriers of the housing with endmost barriers (106, 108) being positioned so they can engage the endmost leads (30E) of the IC device to assure alignment of the lower contact portions with the IC device leads. A rigid board (204, FIG. 11) with connectors (211-214) thereon is mounted on the center of the test clip frame, above the arms, and flexible resilient circuit boards (231-234) each extend in a horizontal loop between the top of the contacts that lie at the top of an arm, to the rigid board where they are coupled to terminals of one of the connectors on the rigid board.

7 Claims, 11 Drawing Sheets

TEST CLIP FOR FINE PITCH IC

CROSS REFERENCE TO RELATED APPLICATION

This is a continuation-in-part of Ser. No. 07/716,564 filed Jun. 17, 1991, now abandoned.

BACKGROUND OF THE INVENTION

Modern high density IC (integrated circuit) devices commonly have bodies with flat horizontal lower surfaces that lie facewise adjacent to a circuit board, and multiple leads that project from two or four sides of the body and extend downwardly to conductive pads on the circuit board. Such a mounted IC device can be tested by a test clip which has multiple contacts that engage the multiple leads of the IC device. U.S. Pat. No. 4,735,580 describes a test adaptor or clip of this type, which includes four frames or arms pivotally mounted on an inner housing or center, with each arm carrying a row of contacts. Each arm can be pivoted to move the lower portions of the contacts against a row of leads extending from one side of the IC device to establish contact therewith. Of course, it is important that each contact engage a predetermined lead, and the above patent assures this by providing barriers on the arm that lie between adjacent contacts, with the barriers entering between pairs of leads as the contacts engage the leads. While such a test clip works well for IC devices with leads of moderately small pitch such as with leads spaced 50 mil (one mil equals one thousandth inch) apart, it is difficult to use such alignment techniques for fine pitch IC devices, where the leads may be closely spaced, such as where they are spaced about 25 mil apart or even less. However, it is still essential that the test clip contacts be aligned with the fine pitch IC leads.

The test adaptor or clip described in the above U.S. Pat. No. 4,735,580 positions the upper ends of the contact so they lie at the top of the arm, where they are accessible for single point probes such as mini grabbers or flying leads. However, such contacts are not convenient for concurrent signal testing used with logic analyzers, which must connect to all the contacts of an arm or of all arms. A fine pitch test clip which aligned its contacts with those of the leads of an IC device sufficiently to assure engagement of each contact with a predetermined lead, and which facilitated the coupling of a logic analyzer or the like to many or all contacts of the leads simultaneously, would be of considerable value.

SUMMARY OF THE INVENTION

In accordance with one embodiment of the present invention, a test clip is provided which can reliably test fine pitch IC (integrated circuit) devices and which facilitate the connection of multi-lead logic analyzers to the clip. The test clip includes a center for lying over the IC device and a plurality of arms that are each pivotally mounted on the center, each arm having a housing and a row of contacts thereon. The contacts have lower portions for pressing forwardly against the IC device leads when the arm is pivoted, and the housing has barriers that separate the lower portions of the contacts. The barriers include a pair of endmost barriers and multiple middle barriers lying therebetween. The lower contact portions extend forwardly further than the middle barriers, but not as far as the endmost barriers. Each endmost barrier has an inner surface which can engage the endmost lead of the IC device to prevent excessive misalignment of the contact lower portions with the leads.

A rigid board is mounted on the center part and holds connectors. Resilient flexible circuit boards extend in horizontal loops between the tops of the arms and the connectors on the rigid board. The lower end of each flexible circuit board has holes receiving the tops of the contacts on an arm, and the upper end of each flexible circuit board is coupled to the connectors on the rigid board.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
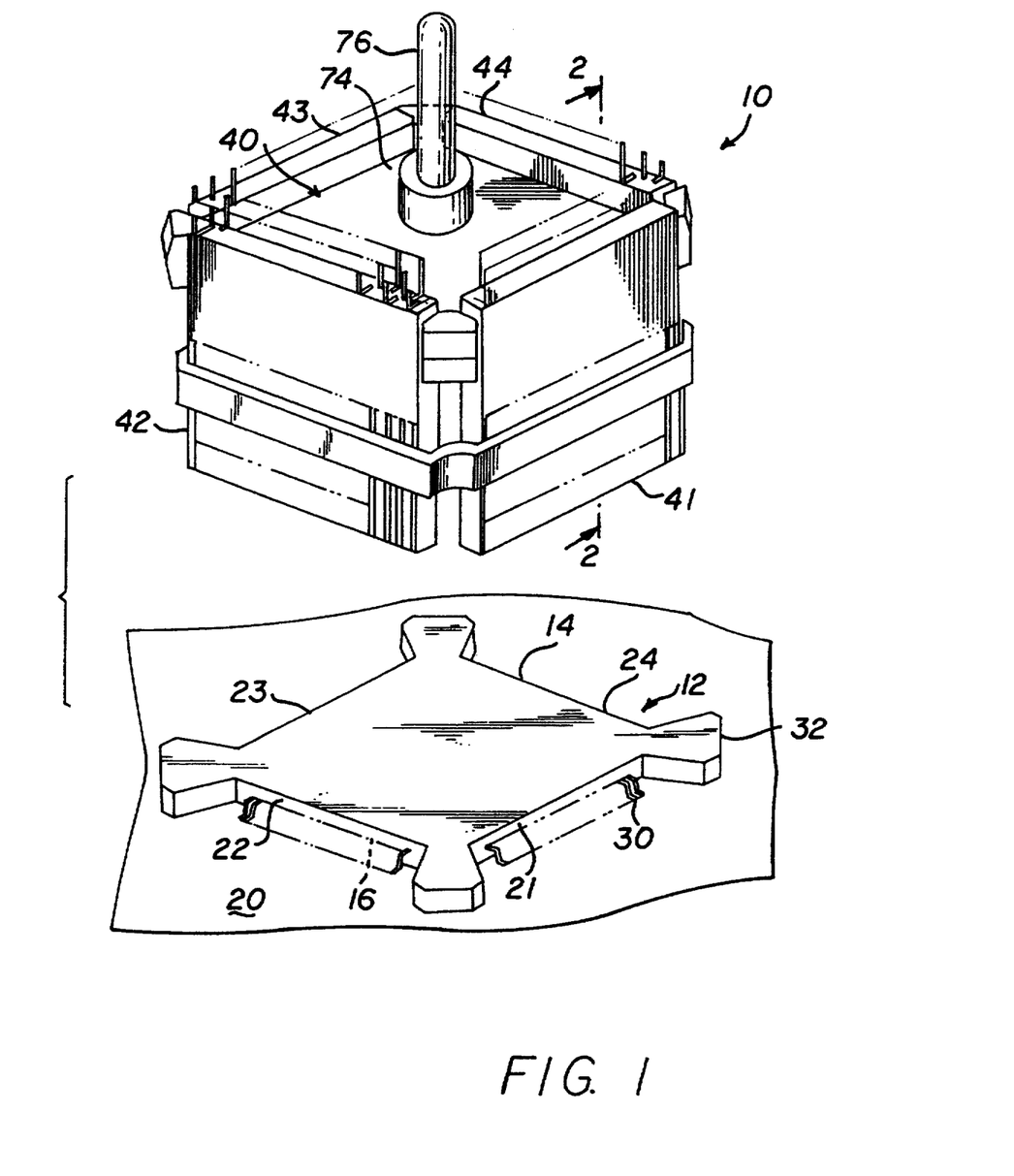
FIG. 1 is an isometric view of a test clip constructed in accordance with the present invention, and of an IC device with which it can be used.

FIG. 1 illustrates a test clip 10 which can engage a surface mount IC (integrated circuit) device 12. The IC device 12 includes a body 14 with a lower surface 16 that can lie horizontally and facewise adjacent to a horizontal upper face 20 of a circuit board. The body 14 has four sides or edges 21-24, and a row of closely spaced leads 30 project from each edge of the body to engage corresponding conductive pads on the upper surface of the circuit board. The particular IC device shown is a PQFP (plastic quad flat pack) whose four edges lie on an imaginary square, and which has a bumper 32 projecting from each corner of the imaginary square. The bumpers protect the leads from mechanical damage during handling and storage.

Figures 2, 3:
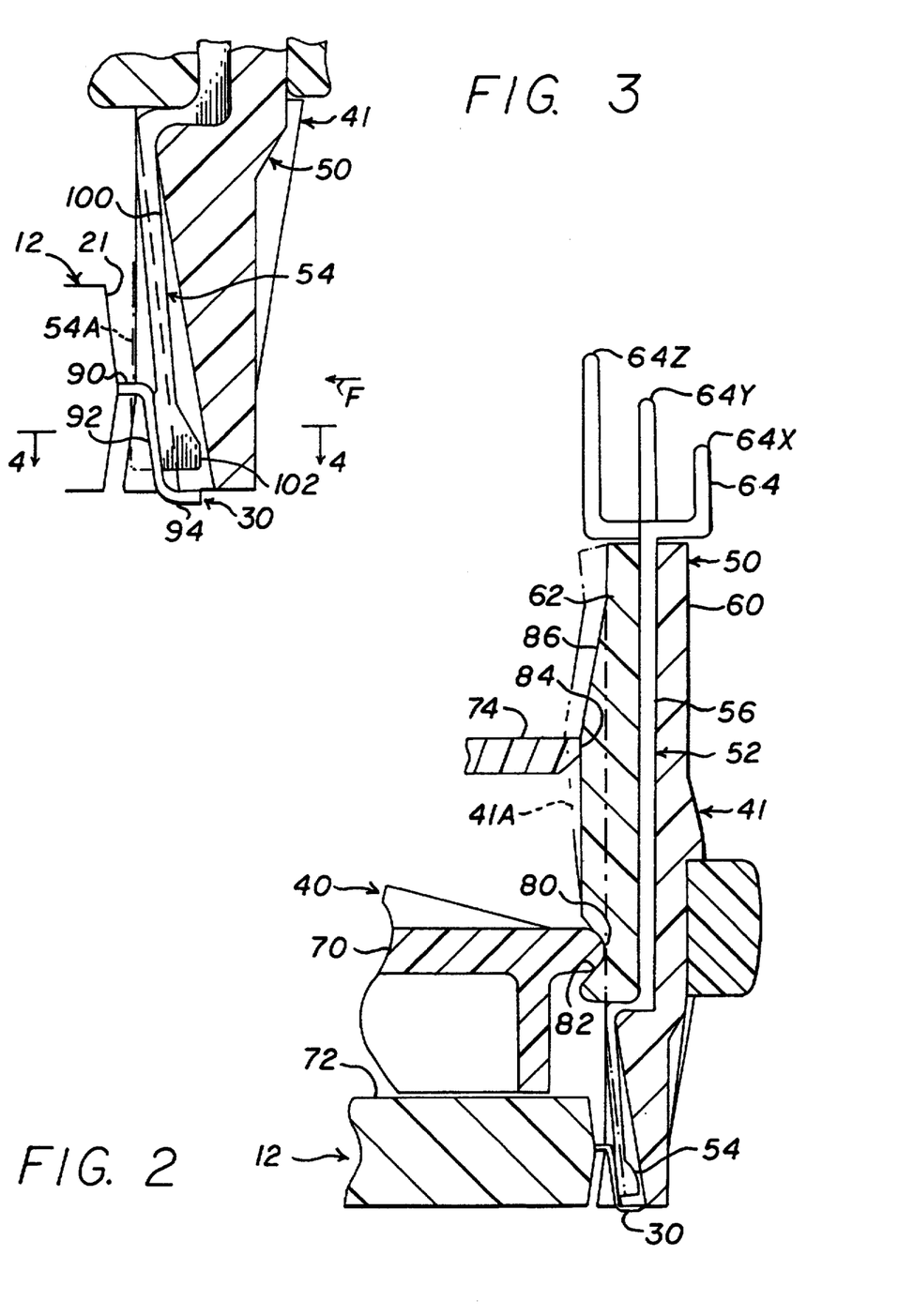
FIG. 2 is a partial sectional view of the test clip of FIG. 1, as taken on line 2—2 of FIG. 1, showing the clip in its fully mated position.
FIG. 3 is an enlarged view of the lower portion of FIG. 2.

The test clip includes a center or center housing 40 designed to lie over the IC device, and four multi-contact arms 41-44 that are each mounted on the center housing. As shown in FIG. 2, each arm such as 41 includes a frame 50 and a row of contacts 52 mounted on the frame, with the number of contact 52 equal to the number of leads 30 on a corresponding edge of the IC device. Each contact has a lower contact portion 54 which can engage one lead 30 of the IC device and which is free to deflect. Each contact also includes a middle portion 56 which is securely held on the frame 50 of the arm. The frame 50 includes a main frame member 60 and a cover 62 that trap the contact middle portions between them. Each contact also has an upper portion 64 which projects upwardly from the upper end of the arm frame. It should be realized that while the term "upper", "lower", "top", etc. are used herein to describe the various orientations of parts with respect to one another, the IC device and test clip can be used in a variety of orientations with respect to gravity.

The center housing 40 of the test clip includes a center section 70 designed to lie stationary over the upper surface 72 of the IC device 12, and also includes a wedge or cam member 74 that can slide up and down relative to the center section 70. A handle 76 (FIG. 1) extends up from the cam member to facilitate holding the test clip and moving the cam member. As shown in FIG. 2, the center section 70 has a pivot edge 80 that is received in a pivot recess 82 of the arm frame, to pivotally mount the arm on the center section. The arm 41 can pivot from the fully mated position shown in solid lines in FIG. 2, to the unmated position shown in phantom lines at 41A. The cam member 74 of the center housing has a camming portion 84 that moves along a cam follower portion 86 on the arm, so that when the cam member 74 is pushed down, it acts as a pivoting device that pivots the arm to the fully mated position 41.

As shown in FIG. 3, each lead 30 of the IC device 12 includes an upper part 90 that extends largely horizontally from an edge 21, a largely vertical part 92 that extends downwardly from the upper part, and a lower part 94 that is designed to press against a circuit board pad. The contact lower portion 54 includes an elongated upper bendable part 100 and a lower mating part 102. In the unmated position of the arm 41, the bendable part 100 extends vertically, while when the arm is pivoted to its fully mated position, the bottom of the arm frame and the mating part 102 of the contact move forwardly, in the direction F. The mating part 102 then engages, or mates with the largely vertical part 92 of the lead. During such mating, the contact lower portion 54 deflects from an initial position 54A relative to the arm frame 50, to the final position shown in solid lines in FIG. 3.

Figure 4:
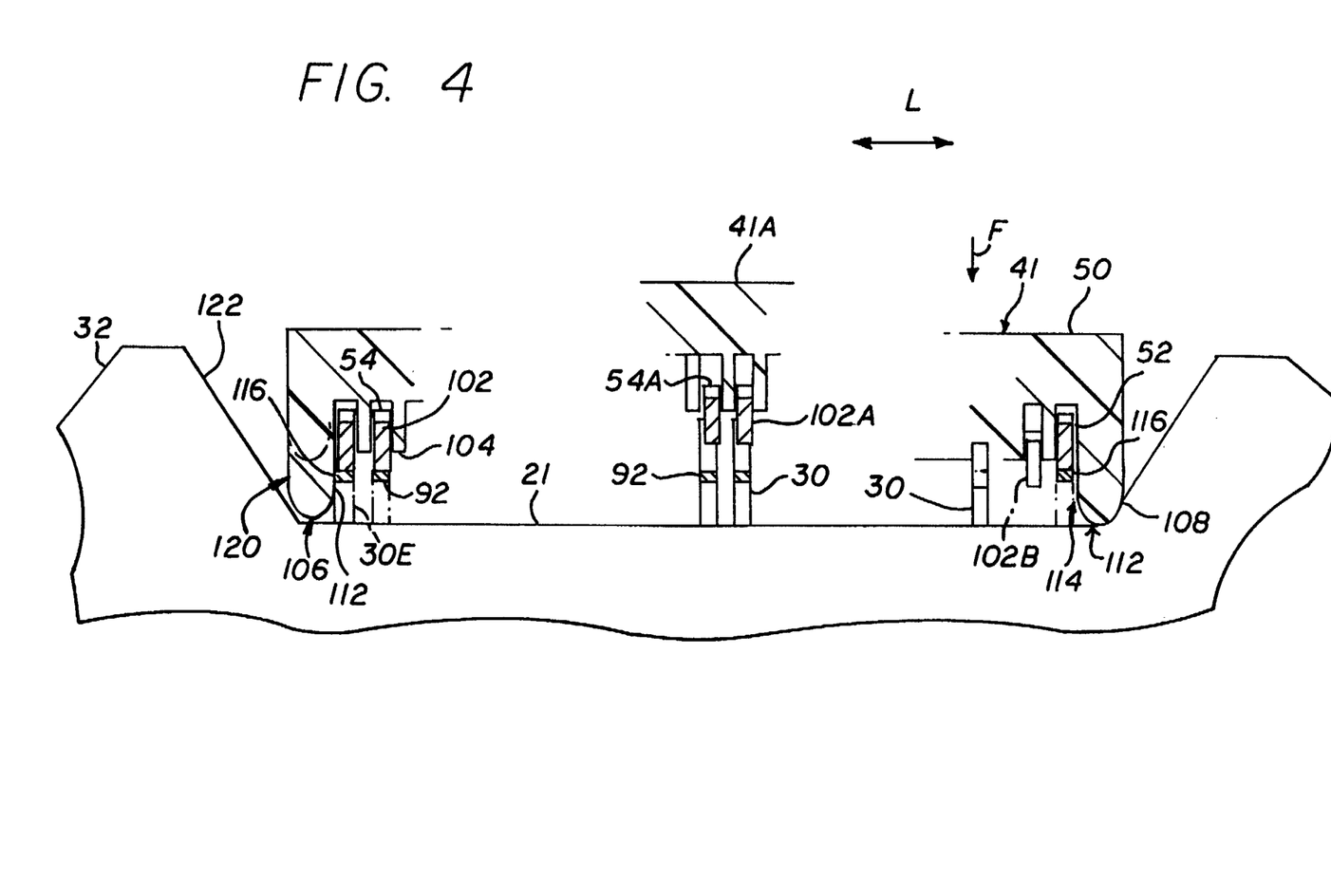
FIG. 4 is a view taken on the line 4—4 of FIG. 3, but with some contacts shown in their unmated position.

As shown in FIG. 4, the arm frame 50 includes a row of barriers separating the contacts from one another, including middle barriers 104 and a pair of endmost barriers 106, 108. The barriers closely confine the mating parts 102 of the contacts to help align each mating part 102 with the largely vertical part 92 of a corresponding lead.

Figure 4A:
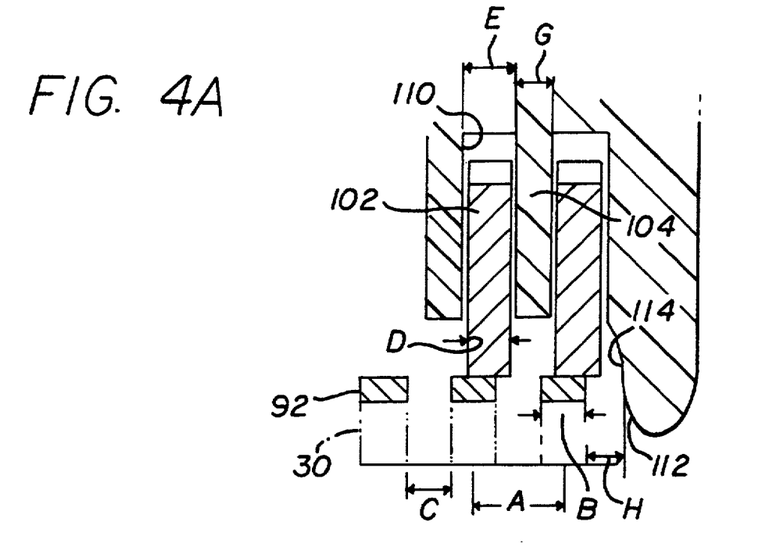
FIG. 4A is an enlarged view of the rightmost portion of FIG. 4.
Figure 5:
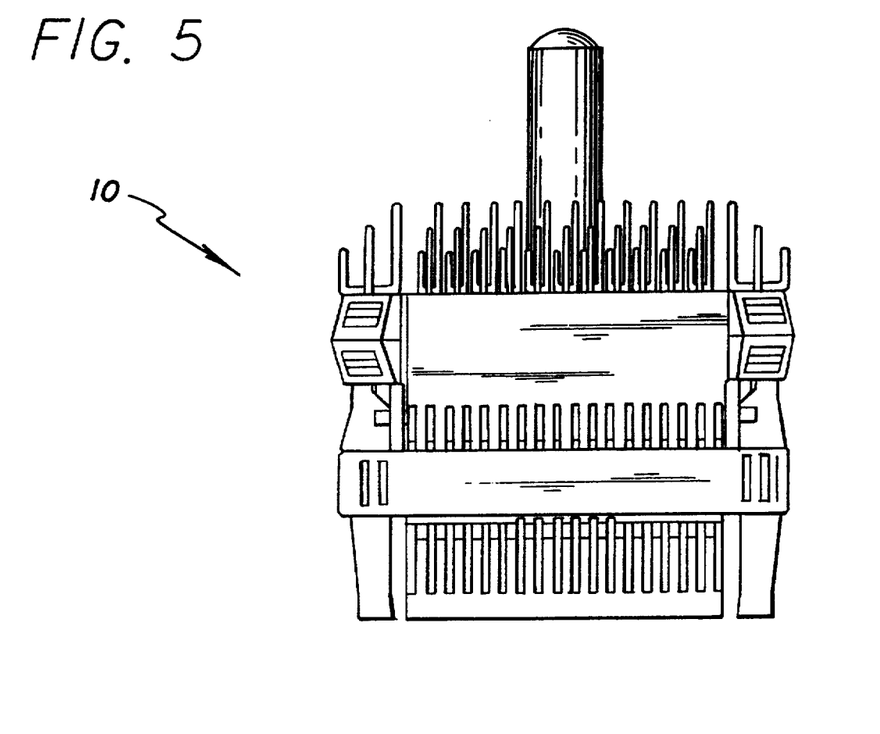
FIG. 5 is a front elevation view of the test clip of FIG. 1.
Figure 6:
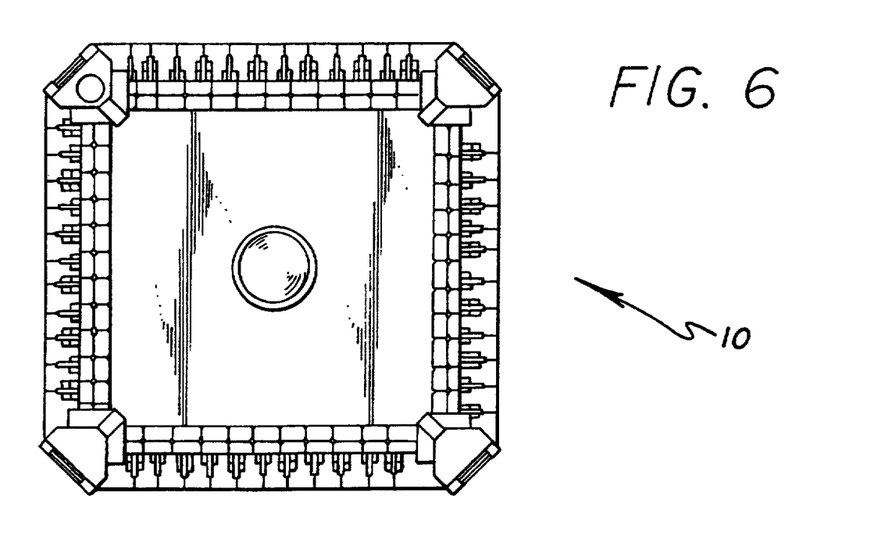
FIG. 6 is a plan view of the test clip of FIG. 5.

As shown in FIG. 4A, the pitch or center-to-center spacing A of the leads is very small, such as 25 mils (one mil equals one thousandth inch) in one type of fine pitch IC device. Each lead has a width B of 12 mils and the leads are spaced apart by a distance C of 13 mils. Each contact mating part 102 has a width D of 12 mils and lies in a cavity 110 having a width E of 15 mils, and each middle barrier 104 has a width G of 10 mils. With such small dimensions of the parts, some misalignment of the contact mating part 102 with the lead part 92 must be tolerated. FIG. 4A shows a situation of about maximum permissible misalignment, where mating parts 102 are shifted about 4 mils from a position of perfect alignment with corresponding lead vertical parts 92. The middle barriers 104 are not constructed to enter between adjacent leads 30, because if there is moderate misalignment then the middle barriers might press on the leads and deform them. As a result, the middle barrier cannot be relied upon to assure accurate alignment of the pivoting arm and its contacts with the IC device and its leads.

In accordance with the present invention, moderately accurate alignment of the contacts with the lead is achieved by relying upon the endmost barriers 106, 108 (FIG. 4). Each end barrier such as 106 has an inner alignment surface 112 at a side closest to the other endmost barrier 108. Each inner side 112 projects forwardly, in the direction F, slightly further than the mating portions 102 of the contacts when the mating portions are undeflected as shown at 102B. The inner surface 112 of each outermost barrier has a location 114 lying opposite the vertical portion of an adjacent lead in the arm mated position. The location 114 lies close enough to the outermost edge 116 of the largely vertical part of the endmost lead 30E, that the endmost barrier locations 114 assure at least minimal alignment of the contacts with the leads to assure that each contact mating part 102 lies opposite a corresponding lead. Each endmost barrier inner surface 112 is inclined from the forward direction F, so progressively more forward locations lie progressively further from the other endmost barrier. As a result, as the arm pivots toward a mating position, the endmost barrier inner surface 112 can engage an endmost lead outer surface 116 and shift the arm laterally along the direction L.

The endmost barriers assure that the maximum amount of misalignment, indicated in FIG. 4A, still results in about one-half to two thirds of the width of the mating surface of each contact mating part lying opposite two thirds of the width of the lead largely vertical part 92. Any greater misalignment is prevented by the inner surface of the endmost barrier abutting an outer edge of an outermost lead, with the maximum distance H being no more than about the width D of a contact. The locations 114 on the endmost barriers are spaced apart by more than the distance between the outermost edges 116 of the outermost leads of a row, but less than the distance between the outermost edges 116 plus the width B of a lead. In the above example, the distance between the outermost barrier locations 114 is about 0.616 inch.

In FIG. 4, a portion of the arm is shown at 41A in the unmated position of the arm. With the arm at 41A, the contact mating parts 102A are spaced from the lead vertical parts 92.

The outermost barriers achieve preliminary alignment by virtue of their outermost alignment surfaces 120 lying close to a corresponding bumper surface 122 as the arm is pivoted towards the fully mated position.

The bumper surface 122 extends at an incline angle M of at least 30°, and preferably at 57.6° (per JEDEC specification MO-069), from an adjacent IC device body side 21 and from the forward direction F as seen in the downward-looking sectional view of FIG. 4. As a result, as the arm pivots towards the fully mated position, the outside surface 120 of each outermost barrier moves progressively closer to the bumper surface 122. The distance between each outermost barrier and an adjacent bumper surface in the fully mated position of the arm, is preferably less than the center-to-center distance E plus G of middle barriers. Although the bumper surface provides initial alignment of the arm, to prevent it from pivoting to the fully mated position if there is considerable misalignment of the arm with the IC device, the inner surfaces 112 of the outermost barriers provide the final alignment.

Figure 9:
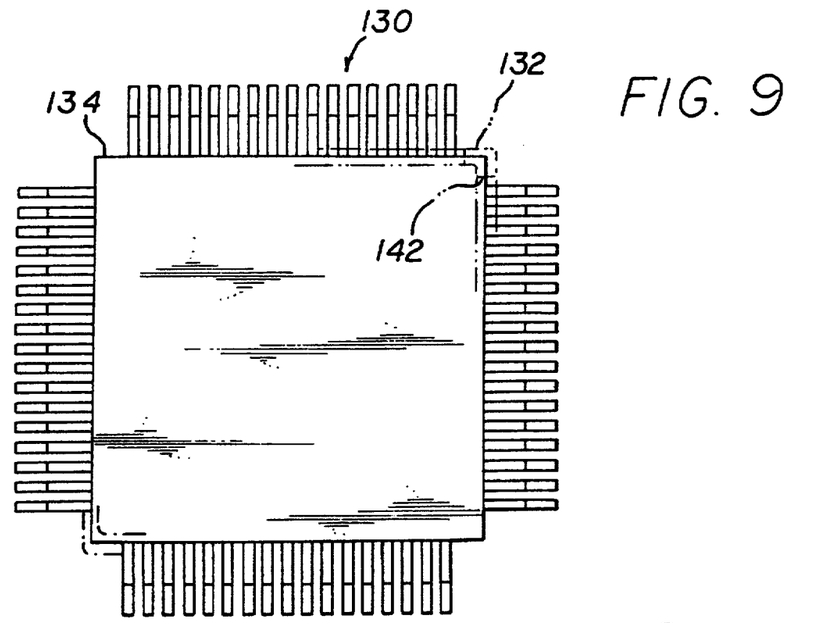
FIG. 9 is a plan view of a CQFP (ceramic quad flat pack) IC device, and showing in phantom line, an adaptor useful therewith.
Figure 10:
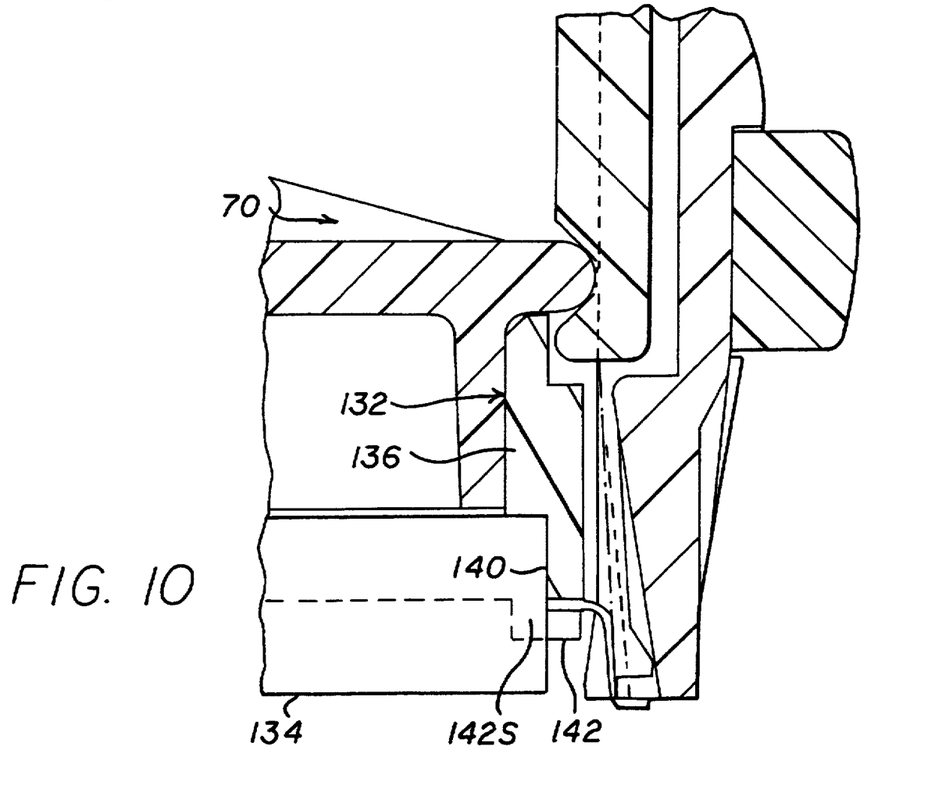
FIG. 10 is a partial sectional view of the test clip of FIG. 3, but with the adaptor indicated in FIG. 9 mounted thereon.

The type of IC device shown at 12 in FIG. 1 which has bumper 32, is the PQFP (plastic quad flat pack) type that is commonly used for mass production. Another type shown in FIG. 9 at 130, is a CQFP (ceramic quad flat pack) that is commonly used for test production or low volume production of an IC device design. The IC device 130 is similar to the other type, except that it does not have corner bumpers which applicant's test lead can use for initial alignment. To provide for moderately accurate preliminary alignment, applicant includes an adaptor 132 which can mount on the body part 134 of the IC device as shown in phantom line in FIG. 9, to accurately align the test clip with the IC device 130. As shown in FIG. 10, the adaptor 132 has an upper part 136 which mounts on the center member 70, and has a lower part 140 that mounts on the IC device body part 134 to accurately align each with the other. The adaptor has four feet 142 lying at its four corners. The outer surface of the outermost barrier is initially aligned by a surface 142s of the foot which can engage the endmost barrier 106 if there is considerable misalignment of the arm with the body of the IC device. Thus, the feet surfaces 142s serve the same purpose as the bumper surface 122 of FIG. 4. The combination body part 134 and adaptor 132 therefore form the equivalent of a body with bumpers at the corners.

Figure 7:
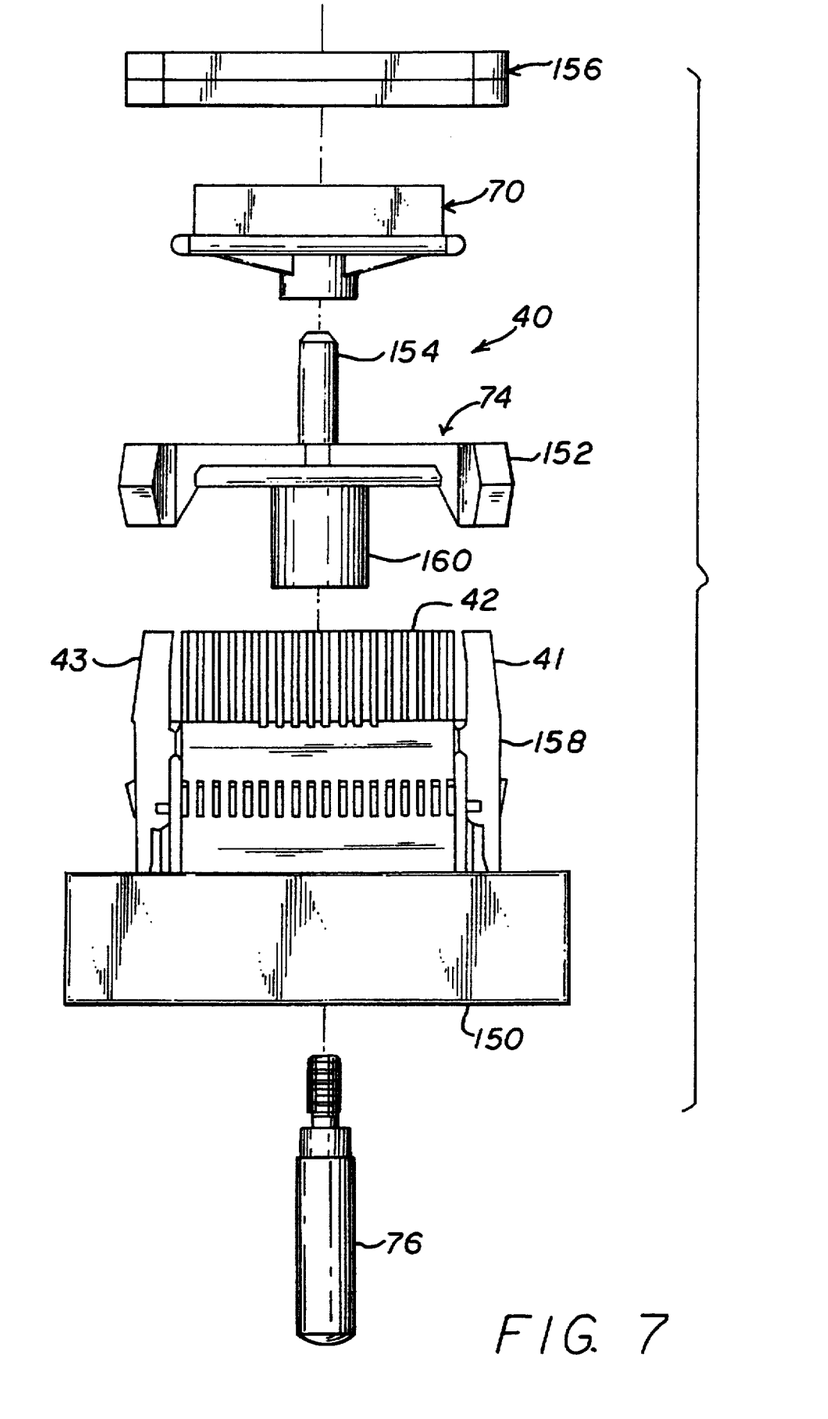
FIG. 7 is an exploded view of the test clip of FIG. 5, shown in an upside-down orientation and indicating how it is assembled, and including a holder used in the assembling.

FIG. 7 shows how the parts of the test clip are assembled. First, the four arms 41–44 are laid on a holder 150 that is used only during assembly, with the arms in an upside-down orientation from that shown in FIG. 1. The cam member 74 is installed, with most of it lying between the arm, but with corner portion 152 lying outside the corners of adjacent arms. The center member 70 is installed over a pin 154 of the cam member. A snap ring 156 snaps over a recess 158 in the arm to lock the arm, cam member 74, and center member 70 together. Finally, the handle 76 is screwed into a threaded part 160 of the cam member, to complete the assembly.

Figure 8:
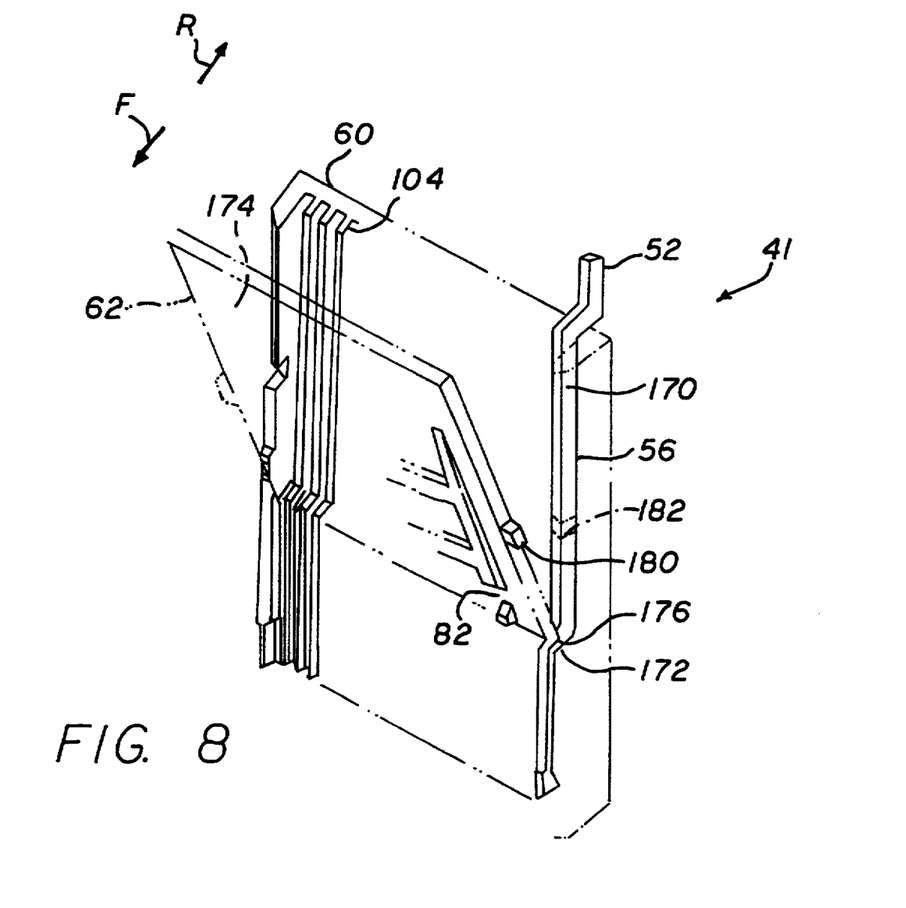
FIG. 8 is a partial isometric view of an arm of the clip of FIG. 2, shown during its assembly.

FIG. 8 illustrates some details of the arm 41 and its assembly. Applicant molds the arm main frame part and cover of LCP (liquid crystal polymer), which is a rigid polymer, to provide high dimensional accuracy and strength. Thus all parts of the main frame, including the middle barriers 104 (FIG. 4) and end barrier 106, 108 are integrally molded of a rigid polymer and are therefore rigidly fixed together. A rigid polymer may be defined as ones with a Young's modulus at room temperature, of more than 3,000 psi, and preferably more than 30,000 psi. To assemble the arm, a group of twenty-five contacts 52 are laid in groves 103 between the barriers such as 104 of the main frame member 60.

Each contact is punched from a sheet of appropriate contact material (thickness of 12 mils) such as beryllium copper. The middle portion 56 of each contact includes an upper middle part 170 which extends vertically, and a lower middle part 172 forming a Z leg (two vertical parts connected by a horizontal part). The cover 62 has a flat rearward surface 174 which presses against the contact upper middle portions 170. The cover also has a lower end 176 which rests on the Z leg lower middle contact portions 172 to press them downwardly as the cover is pivoted from the position shown in phantom lines in FIG. 8, to a position facewise adjacent to the main frame part 60. Guide pins 180 on the cover enter grooves 182 on the main cover part to hold them together until they can be ultrasonically welded together. Thus, the pivoting cover holds down the lower middle parts of the contacts to help assure reliable assembly of the arm.

As shown in FIGS. 1 and 2, three types of contacts are used, all being identical, except for their upper portions 64. Some contacts have rear upper portions 64x, some have middle upper portions 64y, and some have forward upper portions 64z. This arrangement results in three rows of upper contact portion, allowing the upper contact portions to be more widely spaced apart along each of the three rows.

Figure 11:
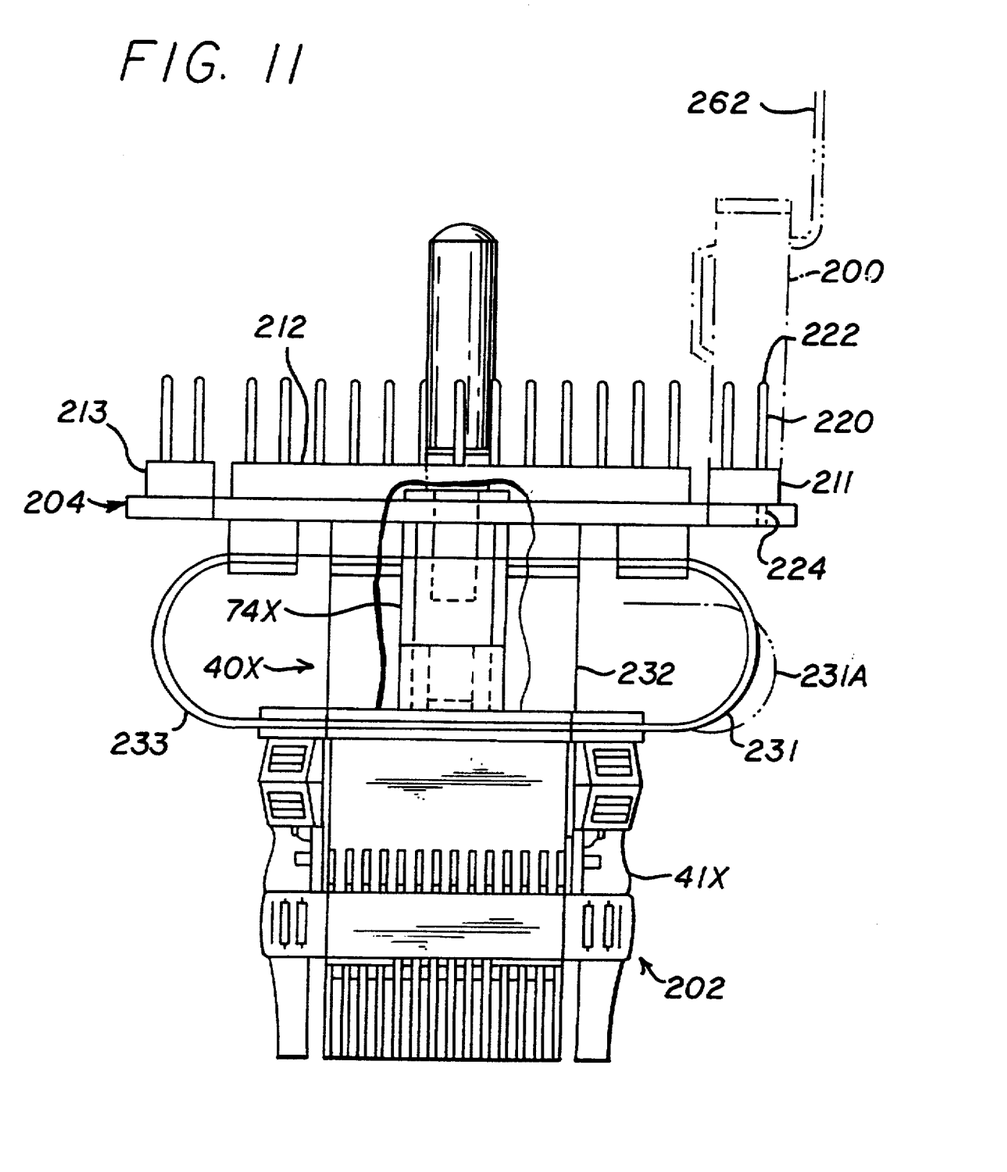
FIG. 11 is a side elevation view of an enhanced test clip constructed in accordance with another embodiment of the invention.
Figure 12:
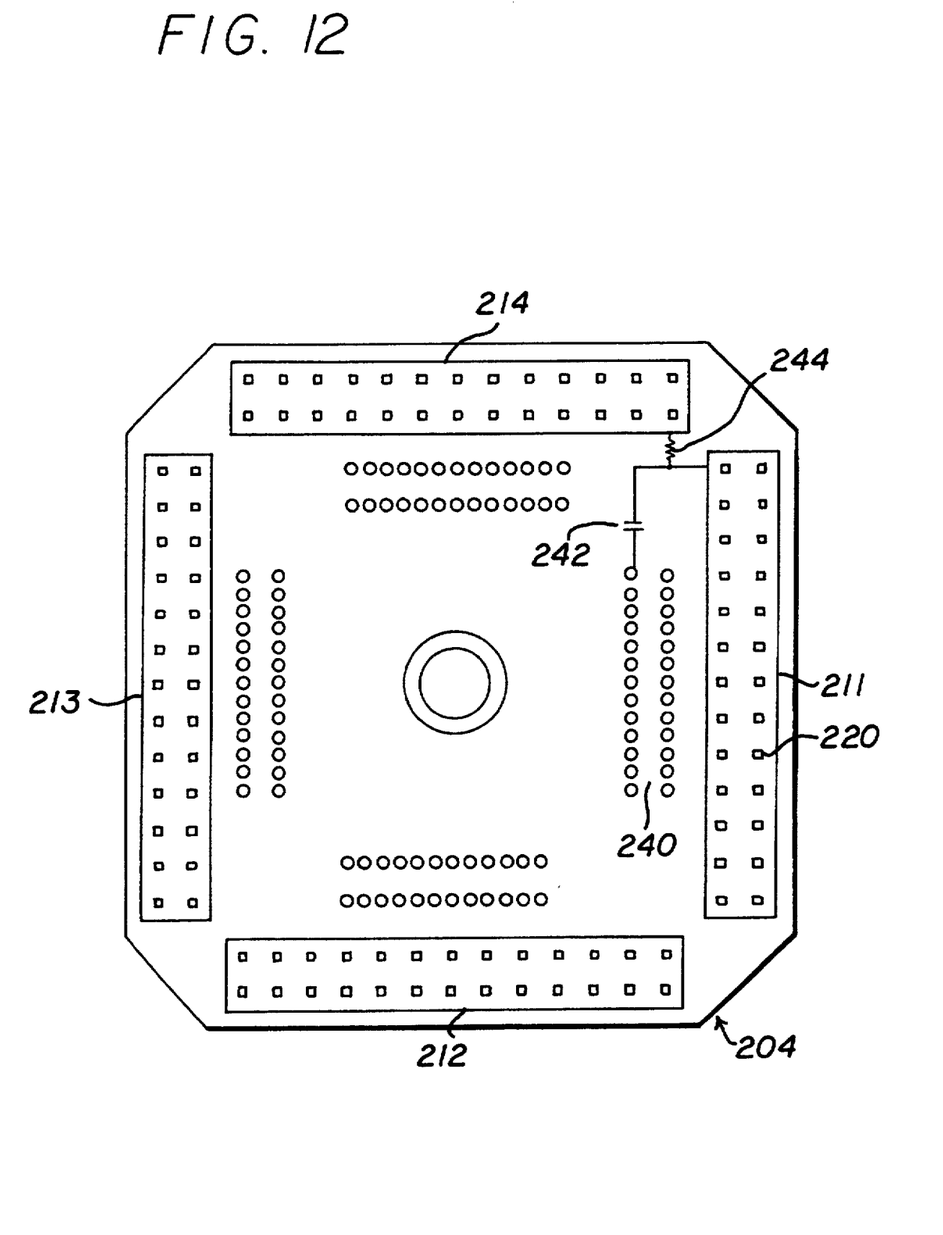
FIG. 12 is a plan view of the enhanced test clip of FIG. 11.

Test equipment can be connected to the test clip by attaching several miniature grabbers to selected contact upper portions, to thereby provide a conductive path to a lead of the IC device. However, it is often desirable to test the IC device with a logic analyzer, which must be connected to all or a large number of the leads, the particular IC device shown having one hundred leads. FIG. 11 shows the test clip arranged so that four connectors 200 can be used to connect a logic analyzer or the like to all 100 contacts of the test clip, and which also enables the test clip to carry signal conditioning circuitry such as miniature resistors and capacitors to minimize loss of signal information between the logic analyzer and the IC device. The test clip 202 includes a rigid board 204 mounted on the center housing 40X, and more specifically on the cam member 74X which moves down and up to mate and unmate the test clip from an IC device. The rigid board carries four connectors 211–214, each having fifty-two terminals 220. The particular connectors shown are of a type commonly referred to as headers, wherein the terminals are pin-shaped at both ends, including an upper pin-shaped end 222 and a lower pin-shaped end 224. The test clip also includes four resilient flexible circuit boards 231–234, each extending between one arm such as 41X and two rows of holes 240 (FIG. 12) on the rigid board 204. Each of the holes 240 is connected by a conductive trace on the rigid board 204, to one of the terminals 220 of the connector 211. The traces can include passive circuit components, such as a capacitor indicated at 242 and a resistor indicated at 244, for conditioning signals. Each flexible circuit boards such 231 can bend as to the position 231A (FIG. 11) when the cam member 74X is moved down. The use of the flexible circuit boards facilitates the assembly of the test clip.

Figure 13:
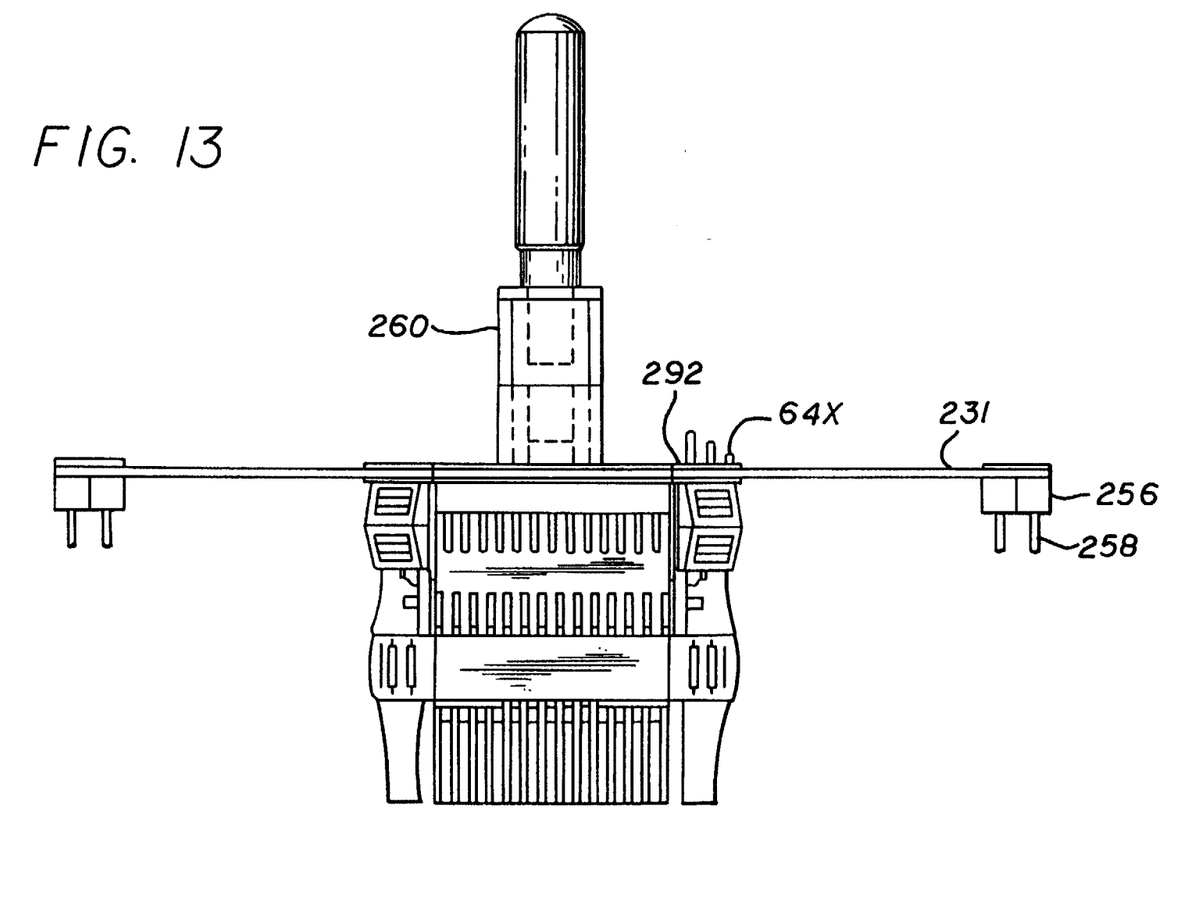
FIG. 13 is a partial side elevation view of the enhanced test clip of FIG. 11, showing it prior to final assembly.
Figure 14:
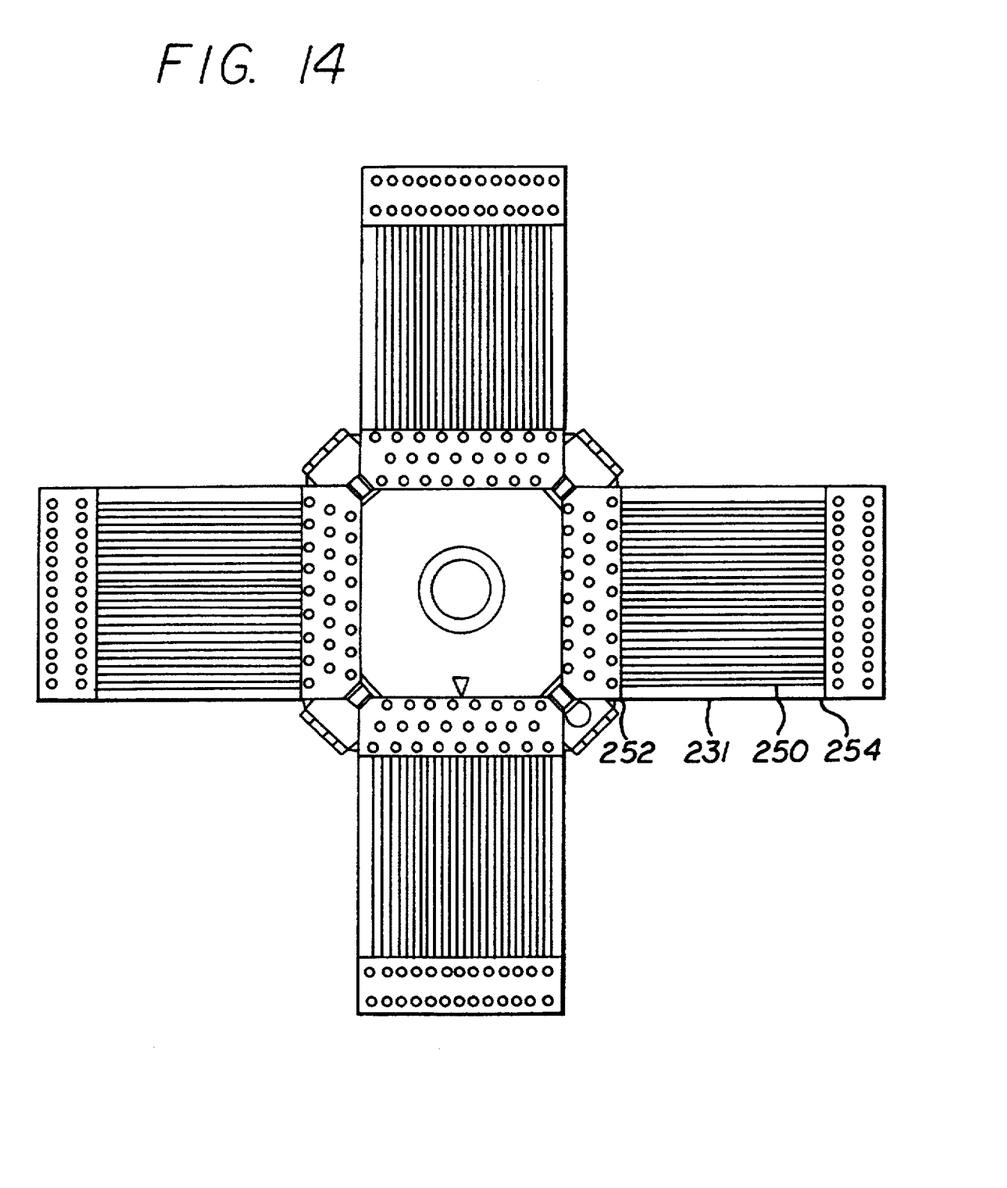
FIG. 14 is a plan view of the test clip of FIG. 13 prior to final assembly.

FIGS. 13 and 14 show the test clip before the rigid board 204 is mounted thereon. Each flexible circuit board such as 231 has multiple flexible traces 250 which have holes at the lower and upper ends 252, 254 of the board. The lower end 252 of the board is placed over the upper portions 64x, 64y, 64z of the contact and soldered in place to connect each conductive trace to one pin. An intermediate connector device 256 is mounted to the upper end of the flexible circuit board. Thereafter, an extension 260 can be mounted on the cam member, the rigid board 204 can be mounted thereon, and pin terminals 258 of the connector device 256 can be plugged into the holes 240 on the rigid board to complete the test clip. A connector 200 connected to the end of a ribbon cable 262 extending from a logic analyzer, can be plugged into the terminals 220 of the connectors such as 211 on the rigid board.

Thus, the invention provides a test clip which is especially useful for IC devices with rows of leads spaced at a fine pitch, and which facilitates connection of the test lead contacts to a logic analyzer or the like that must connect simultaneously to many leads. The test clip has a center that lies over the IC device and also includes a plurality of arms containing contacts with lower contact portions that engage or mate with the leads of the IC device. The body of the arm has multiple barriers that separate the contact lower portions, including middle barriers and a pair of endmost barriers. The endmost barriers extend forwardly towards the IC device body further than the middle barriers, and preferably further than the contact lower portions. The inner surface of each endmost barrier can engage the outside edge of an outermost lead, to assure that the mating part of each contact lower portion is sufficiently aligned with a lead, that each contact portion engages a single predetermined lead. A rigid board can be mounted on the center of the clip above the upper ends of the arms, the board holding a plurality of connectors. The clip also includes a plurality of resilient flexible circuits, each having a lower end coupled to the top of an arm and each having an upper end coupled to the rigid board. The flexible circuit board has a row of conductors that each connects one contact to one location on the rigid board that is coupled to one terminal of a connector. This arrangement facilitate connections to the test clip, and also enables signal conditioning close to the IC device leads by components on the rigid board or even on the flexible circuit.

Although particular embodiments of the invention have been described and illustrated herein, it is recognized that modifications and variations may readily occur to those skilled in the art, and consequently, it is intended that the claims be interpreted to cover such modifications and equivalents.

We claim:

1. A fine pitch test clip for connecting to the leads of an IC (integrated circuit) device that includes a body with a lower surface that can lie horizontally and with a plurality of edges, and a row of closely spaced leads projecting partially horizontally away from each of a plurality of said edges with each lead having a largely vertical part, and with each row of leads including a pair of endmost leads each lying at an end of the row and each having an outermost edge, wherein the test clip includes a center for lying over the IC device, and a plurality of multi-contact arms each mounted on said center with each arm including a frame and a row of contacts mounted on said frame, said row of contacts having lower portions spaced apart so each contact lower portion can engage a corresponding IC lead, said row of contacts including endmost contacts with endmost contact lower portions, said frame including plurality of barriers, said barriers including middle barriers that each lie between a pair of said contact lower portions and a pair of endmost barriers each lying closely beyond one of said endmost contact lower portions, characterized by:

each of said endmost barriers extends forwardly towards said IC body further than said middle barriers, with each endmost barrier having an inner surface that lies closest to the other end barrier, each end barrier inner surface having a location close enough to the outermost edge of the endmost lead of a row, to assure that each contact lower portion lies opposite a corresponding lead; and each of said leads having largely vertical parts and each of said contact lower portions has about the same width along the length of said rows, and the distance between said end barrier locations is greater than the distance between the outermost edges of the endmost leads of a corresponding row, but less than said distance between the outermost edges plus the width of one lead.

2. A fine pitch test clip for connecting to the leads of an IC (integrated circuit) device that includes a body with a lower surface that can lie horizontally and with a plurality of edges, and a row of closely spaced leads projecting partially horizontally away from each of a plurality of said edges with each lead having a largely vertical part, and with each row of leads including a pair of endmost leads each lying at an end of the row and each having an outermost edge, wherein the test clip includes a center for lying over the IC device, and a plurality of multi-contact arms each mounted on said center with each arm including a frame and a row of contacts mounted on said frame, said row of contacts having lower portions spaced apart so each contact lower portion can engage a corresponding IC lead, said row of contacts including endmost contact with endmost contact lower portions, said frame including a plurality of barriers, said barriers including middle barriers that each lie between a pair of said contact lower portions and a pair of endmost barriers each lying closely beyond one of said endmost contact lower portions, characterized by:

each of said endmost barriers extends forwardly towards said IC body further than said middle barriers, with each endmost barrier having an inner surface that lies closest to the other end barrier, each end barrier inner surface having a location close enough to the outermost edge of the endmost lead of a row, to assure that each contact lower portion lies opposite a corresponding lead;

each of said arms is pivotally mounted on said center section substantially about an axis extending parallel to the length of the corresponding row of contacts, and said test clip includes a pivoting device which pivots said arms to move said row of contact lower portions in a forward direction to engage said lead largely vertical parts;

each of said endmost barrier inner surfaces is inclined from said forward direction as seen in a downward-looking sectional view, so locations on said barrier inner surface which lie progressively closer to said IC body edge lie progressively further from the other endmost barrier of that arm.

3. A fine pitch test clip for connecting to the leads of an IC (integrated circuit) device that includes a body with a lower surface that can lie horizontally and with four edges lying on an imaginary rectangle having an axis, said body having four bumpers each extending largely radially from said axis at each of said corners with each bumper having opposite bumper sides extending at an angle of a plurality of degrees from a side of said rectangle, said IC device having a row of closely spaced leads projecting partially horizontally away from each of a plurality of said edges with each lead having a largely vertical part, and with each row of leads including a pair of endmost leads each lying at an end of the row and each having an outermost edge, wherein the test clip includes a center for lying over the IC device, and a plurality of multi-contact arms each mounted on said center with each arm including a frame and a row of contacts mounted on said frame, said row of contacts having lower portions spaced apart so each contact lower portion can engage a corresponding IC lead, said row of contacts including endmost contacts with endmost contact lower portions, said frame including a plurality of barriers, said barriers including middle barriers that each lie between a pair of said contact lower portions and a pair of endmost barriers each lying closely beyond one of said endmost contact lower portions, characterized by:

each of said endmost barriers extends forwardly towards said IC body further than said middle barriers, with each endmost barrier having an inner surface that lies closest to the other end barrier, each end barrier inner surface having a location close enough to the outermost edge of the endmost lead of a row, to assure that each contact lower portion lies opposite a corresponding lead;

each of said endmost barriers has an outer surface with a forward end portion that lies close to an adjacent one of said bumper sides when the arm is in a fully mated position wherein positioned so said contact lower portions fully engage said leads, with the average distances between said barrier outer surfaces and adjacent bumper sides being less than the spacing between the middles of said middle barriers, but with the distance between each end barrier inner side and an adjacent lead being less than said average distance between said barrier outer surfaces and adjacent bumper sides.

4. The test clip described in claim 3 wherein:
said IC body includes a body part and an adaptor, said body part forming said four edges that lie on an imaginary rectangle, and said adaptor fits over said body part and has a foot at each of said corners forming one of said bumpers.

5. A fine pitch test clip for connecting to the leads of an IC (integrated circuit) device that includes a body with a lower surface that can lie horizontally and with a plurality of edges, and a row of closely spaced leads projecting partially horizontally away from each of a plurality of said edges with each lead having a largely vertical part, and with each row of leads including a pair of endmost leads each lying at an end of the row, wherein the test clip includes a center for lying over the IC device, and a plurality of multi-contact arms each mounted on said center with each arm including a frame and a row of contacts mounted on said frame, said row of contacts having lower portions spaced apart so each contact lower portion can engage a corresponding IC lead, said row of contacts including endmost contacts with endmost contact lower portions, said frame including a plurality of barriers including middle barriers that each lie between a pair of said contact lower portions and a pair of endmost barriers each lying closely beyond one of said endmost contact lower portions, characterized by:

each of said arms includes a main frame part with upper and lower portions and a cover, said main frame part forming said barriers and a groove between each pair of barriers, with each contact lying in one of said grooves, and said cover lying over said barriers at said upper frame portion to trap said contacts in place;

each said contact has a middle portion forming a Z leg with a middle part extending primarily horizontally, and said cover has a lower end that can press down said contact middle as said cover pivots on its lower end until the cover substantially abuts said middle barriers at the upper portion of said housing.

6. A fine pitch test clip for connecting to the leads of an IC (integrated circuit) device that includes a body with a lower surface that can lie horizontally and with a plurality of edges, and a row of closely spaced leads projecting partially horizontally away from each of a plurality of said edges with each lead having a largely vertical part, and with each row of leads including a pair of endmost leads each lying at an end of the row and each having an outermost edge, wherein the test clip includes a center for lying over the IC device, and a plurality of multi-contact arms each mounted on said center with each arm including a frame and a row of contacts mounted on said frame, each of said rows of contacts having lower portions spaced apart so each contact lower portion can engage a corresponding IC lead, each of said rows of contacts including endmost contacts with endmost contact lower portions, said frame including a plurality of integral barriers, said barriers including middle barriers that each lie between a pair of said contact lower portions and a pair of endmost barriers each lying closely beyond one of said endmost contact lower portions of each of said rows of contacts, characterized by:

each of said endmost barriers extends forwardly towards said IC body further than said middle barriers, with each endmost barrier having an inner surface that lies closest to the other end barrier, each end barrier inner surface having a location which is at the same height as and which lies close enough to the outermost edge of the endmost lead of a row, so the end barrier inner surface can engage the outermost edge of the endmost lead to limit misalignment of the contact lower portions with the leads, thereby to assure that each contact lower portion lies opposite a corresponding lead.

7. A fine pitch test clip for connecting to the leads of an IC (integrated circuit) device that includes a body with a lower surface that can lie horizontally and with a plurality of edges, and a row of closely spaced leads projecting partially horizontally away from each of a plurality of said edges with each lead having a largely vertical part, and with each row of leads including a pair of endmost leads each lying at an end of the row and each having an outermost edge, comprising:

a test clip center lying over the IC device, and a plurality of multicontact arms each pivotally mounted on said center;

each arm including a frame and a row of contacts mounted on said frame including a pair of endmost contacts of the row, said row of contacts having lower portions spaced apart so each contact lower portion can engage a corresponding IC lead when the arm pivots to move said contact lower portions in a predetermined forward direction towards said leads, said frame including a plurality of barriers including middle barriers that each lie between a pair of said contact lower portions and a pair of endmost barriers each lying closely beyond the contact lower portion of one of said endmost contacts;

each of said endmost barriers extends in said forward direction towards said IC body further than said middle barriers, with each endmost barrier having an inner surface that lies closest to the other end barrier, each end barrier inner surface having a location spaced a distance H in a direction that is parallel to a row of contacts, from the outermost edge of the endmost lead of a row, by no more than about the width of each contact lower portion, to assure that each contact lower portion lies opposite a corresponding lead.

* * * * *

UNITED STATES PATENT AND TRADEMARK OFFICE
CERTIFICATE OF CORRECTION

PATENT NO. : 5,373,230
DATED : December 13, 1994
INVENTOR(S) : Marik Balyasny and Mark S. Fisher It is certified that error appears in the above-identified patent and that said Letters Patent is hereby corrected as shown below:

On the title page, item

[54], in the title "Five" should read "Fine"; and

Column 1, line 2, in the title "Five" should read "Fine".

Signed and Sealed this

Fourteenth Day of March, 1995

Attest:

BRUCE LEHMAN

*Attesting Officer*     *Commissioner of Patents and Trademarks*